United States Patent
Bao et al.

(10) Patent No.: US 10,256,322 B2
(45) Date of Patent: Apr. 9, 2019

(54) CO-DOPING PROCESS FOR N-MOS SOURCE DRAIN APPLICATION

(71) Applicant: Applied Materials, Inc., Santa Clara, CA (US)

(72) Inventors: Xinyu Bao, Fremont, CA (US); Zhiyuan Ye, San Jose, CA (US); Hua Chung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/926,921

(22) Filed: Mar. 20, 2018

(65) Prior Publication Data

US 2018/0286962 A1    Oct. 4, 2018

Related U.S. Application Data

(60) Continuation-in-part of application No. 15/896,983, filed on Feb. 14, 2018, which is a division of application No. 15/479,091, filed on Apr. 4, 2017, now Pat. No. 9,923,081.

(51) Int. Cl.
| | |
|---|---|
| *H01L 21/00* | (2006.01) |
| *H01L 29/66* | (2006.01) |
| *H01L 29/78* | (2006.01) |
| *H01L 29/167* | (2006.01) |
| *H01L 29/08* | (2006.01) |
| *H01L 29/06* | (2006.01) |

(52) U.S. Cl.
CPC ...... *H01L 29/6659* (2013.01); *H01L 29/0653* (2013.01); *H01L 29/0847* (2013.01); *H01L 29/167* (2013.01); *H01L 29/66795* (2013.01); *H01L 29/7834* (2013.01); *H01L 29/7851* (2013.01)

(58) Field of Classification Search
CPC ......... H01L 21/02639; H01L 21/02532; H01L 21/02636; H01L 21/0245; H01L 21/0262
See application file for complete search history.

(56) References Cited

U.S. PATENT DOCUMENTS

| | | | |
|---|---|---|---|
| 7,132,338 B2 | 11/2006 | Samoilov et al. | |
| 7,897,495 B2 | 3/2011 | Ye et al. | |
| 8,563,384 B2 | 10/2013 | Ranade et al. | |
| 9,653,465 B1* | 5/2017 | Balakrishnan | H01L 27/0922 |
| 9,923,081 B1* | 3/2018 | Bao | H01L 29/6659 |
| 2006/0115934 A1 | 6/2006 | Kim et al. | |
| 2006/0166414 A1 | 7/2006 | Carlson et al. | |
| 2009/0215249 A1* | 8/2009 | Boland | H01L 21/02381 438/483 |

(Continued)

*Primary Examiner* — Nicholas J Tobergte
(74) *Attorney, Agent, or Firm* — Patterson + Sheridan LLP

(57) ABSTRACT

A device comprising Si:As source and drain extensions and Si:As or Si:P source and drain features formed using selective epitaxial growth and a method of forming the same is provided. The epitaxial layers used for the source and drain extensions and the source and drain features herein are deposited by simultaneous film formation and film etching, wherein the deposited material on the monocrystalline layer is etched at a slower rate than deposition material deposited on non-monocrystalline location of a substrate. As a result, an epitaxial layer is deposited on the monocrystalline surfaces, and a layer is not deposited on non-monocrystalline surfaces of the same base material, such as silicon.

18 Claims, 2 Drawing Sheets

(56) References Cited

U.S. PATENT DOCUMENTS

| | | |
|---|---|---|
| 2012/0024223 A1* | 2/2012 | Torres, Jr. ............... C23C 16/24 |
| | | 117/104 |
| 2013/0161745 A1 | 6/2013 | Ando et al. |
| 2014/0120678 A1* | 5/2014 | Shinriki ............ H01L 29/66795 |
| | | 438/283 |
| 2014/0312425 A1* | 10/2014 | Adam ............... H01L 29/66795 |
| | | 257/352 |
| 2016/0043190 A1 | 2/2016 | Banghart et al. |
| 2017/0222054 A1 | 8/2017 | Banghart et al. |
| 2017/0236930 A1 | 8/2017 | Sun et al. |

* cited by examiner

CO-DOPING PROCESS FOR N-MOS SOURCE DRAIN APPLICATION

CROSS-REFERENCE TO RELATED APPLICATIONS

This application is a continuation-in-part of U.S. patent application Ser. No. 15/896,983 filed on Feb. 14, 2018 which is a divisional of U.S. patent application Ser. No. 15/479,091 filed on Apr. 4, 2017, both of which are herein incorporated by reference in their entireties.

BACKGROUND

Field

Embodiments of the present disclosure generally relate to the field of semiconductor manufacturing processes and devices, and more particularly, to methods for epitaxial growth of a source and drain extension on a substrate and devices formed using those methods.

Reliably producing sub-half micron and smaller features is one of the key technology challenges for the next generation of very large scale integration (VLSI) and ultra large scale integration (ULSI) of semiconductor devices. As the limits of circuit technology are pushed, the shrinking dimensions of integrated circuits manufactured using VLSI and ULSI technology have placed additional demands on processing capabilities.

As circuit densities increase for next generation devices, the widths of interconnects, such as vias, trenches, contacts, gate structures and other features, decrease to 22 nm or smaller dimensions, and the dimensions of the dielectric materials therebetween likewise shrink. In one methodology to enable the fabrication of next generation devices and structures, three dimensional (3D) stacking of semiconductor device features is used. In particular, field effect transistors, wherein the underlying silicon of the substrate projects upwardly or outwardly as an elongated mesa or "fin" (FinFETs), are often utilized as a 3D structure in a semiconductor device. By arranging transistors in three dimensions instead of the conventional two dimensions, a greater number of transistors may be located in an integrated circuit (IC) device of a given size and located very close to one another.

FinFET devices typically include semiconductor fins with a high aspect ratio in cross section, over which the channel and source and drain features for the transistor are formed. A gate electrode is formed over a portion of the fin, to utilize the advantage of the increased surface area of the channel and source and drain features to produce faster, more reliable and better-controlled semiconductor transistor devices. Further advantages of FinFETs include reducing the short channel effect and allowing higher current flow therein than an equivalent two dimensional transistor structure covering the same substrate area.

Typically, in an nMOS process flow to form a FinFET, a dummy gate is formed over the fin, and side wall spacers are formed over the sides of the dummy gate before source and drain extensions are formed on the side wall of the fin below the dummy gate and on the adjacent surfaces of the substrate extending from both sides of the fin. In the typical process, the source and drain extensions are formed by doping the silicon of the fin and the adjacent silicon substrate surface by ion implantation using a tilted implant beam in order to access the sides of the fin, which are shadowed by the spacers and/or dummy gate. In these 3D structures it is difficult to use a tilted beam and still yield a relatively uniform concentration of the doping element(s) while simultaneously overcoming the shadowing caused by the presence of the spacers and/or dummy gate. The side wall spacers shadow the upper portion of the side wall of the fin, and accordingly, a non-uniform concentration of the implanted dopant species occurs with a lower dopant concentration toward the top of the fin than at the base of the fin, leading to inconsistent transistor performance. For fins with a thickness of 7 nm or less, ion implanted source and drain extensions have a non-uniform doping profile concentration which causes lower ON current by creating an undesirable shorter undoped channel length, and higher OFF leakage which leaves the channel in an undesirable ON state even when there is no voltage applied to the gate.

Accordingly, there is a need in the art for uniform concentration, and/or predictable concentration, doping of source and drain extensions of a FINFET or other three-dimensional device.

SUMMARY

Embodiments described herein generally relate to a semiconductor device and methods for manufacturing the semiconductor device.

In one embodiment, a method of selectively forming a lightly doped silicon arsenic (Si:As) epitaxial layer on a monocrystalline surface of a substrate or features thereon, followed by selectively depositing a highly doped Si:As epitaxial layer or a highly doped phosphorus silicon (Si:P) epitaxial layer thereover, is provided. In the method, a substrate having both monocrystalline surfaces, and polycrystalline and/or amorphous surfaces, is loaded into a processing chamber, and is heated to a desired processing temperature. A gas containing a halogenated silicon precursor, an arsenic precursor, and a carrier gas are flowed into the processing chamber and the heated substrate is exposed thereto. The gas reacts with, and selectively "grows", i.e., epitaxial forms by a deposition process, a lightly doped Si:As epitaxial layer on only the exposed monocrystalline surfaces integral to, or located on, the substrate, and the exposed polycrystalline and/or amorphous surfaces of the substrate remain exposed, i.e., not deposited upon. A highly doped Si:As or Si:P epitaxial layer is then selectively "grown", i.e. epitaxially formed by a deposition process on the lightly doped epitaxial Si:As layer.

In another embodiment, source and drain extensions and source and drain features in a 3D FinFET CMOS device are formed of doped epitaxial layers. In this embodiment, one or more STI regions define an active region of or on the substrate. An undoped monocrystalline feature is located on, or integrally provided as, the substrate within the active region. A lightly doped Si:As epitaxial layer is deposited (grown) on the monocrystalline surfaces within the active region of the substrate and thus on the undoped monocrystalline feature. A highly doped Si:As or Si:P epitaxial layer is then deposited (grown) on the lightly doped Si:As epitaxial layer.

In another embodiment, a method of depositing a layer includes heating a substrate in a processing chamber to a processing temperature, the substrate having one or more monocrystalline surfaces and one or more non-monocrystalline surfaces, flowing a processing gas into the processing chamber, the processing gas comprising a halogenated silicon precursor, an arsenic precursor, and a carbon precursor, and selectively depositing an epitaxial Si:As:C layer on the one or more monocrystalline surfaces. In some embodiments, the epitaxial Si:As:C layer comprises a combination of epitaxial Si:As and epitaxial Si:As:C sublayers.

In another embodiment, a method of forming a device includes heating a substrate to a first processing temperature in a processing chamber, the substrate having one or more features disposed on the substrate, the substrate and the one or more features having at least monocrystalline surfaces and amorphous surfaces, flowing a gas into the processing chamber, the gas comprising a halogenated silane, an arsenic precursor, and a carbon precursor, and selectively depositing an epitaxial Si:As:C layer on the monocrystalline surfaces. In some embodiments, the epitaxial Si:As:C layer comprises a combination of epitaxial Si:As and epitaxial Si:As:C sublayers.

In another embodiment, a semiconductor device includes a substrate, one or more shallow trench isolation regions defining an active region on the substrate, each of the one or more shallow trench isolation regions comprising a dielectric material, an undoped monocrystalline feature disposed on the substrate in the active region, and a first epitaxial silicon layer. The first epitaxial silicon layer includes a horizontal portion located on the substrate and a vertical portion normal to the horizontal portion and adjacent to the undoped monocrystalline feature. The horizontal portion has a first end proximate to one of the one or more shallow trench isolation regions and a second end adjacent to the undoped monocrystalline feature. The first end has a first arsenic concentration and a first carbon concentration at a distance from the substrate. The vertical portion has a third end adjacent to the second end of the horizontal portion and a fourth end distal to the third end. The fourth end has a second arsenic concentration and a second carbon concentration at a distance from the horizontal portion. Herein, the first arsenic concentration and the second arsenic concentration have a variation of less than about 10% and the first carbon concentration and the second carbon concentration have a variation of less than about 10%. In some embodiments, the semiconductor device further includes a second epitaxial silicon layer on the first epitaxial silicon layer. In some embodiments, the horizontal portion of the first epitaxial silicon layer extends on the active area between the undoped monocrystalline feature and the one of the one or more shallow trench isolation regions and terminates adjacent to an interface of the active region and the one of the one or more shallow trench isolation regions. In some embodiments, the second epitaxial silicon layer has a uniform arsenic concentration of between about $2\times10^{20}$ cm$^{-3}$ and about $5\times10^{21}$ cm$^{-3}$. In some embodiments, the second epitaxial silicon layer has a phosphorous concentration between about $2\times10^{20}$ cm$^{-3}$ and about $5\times10^{21}$ cm$^{-3}$. In some embodiments, the first epitaxial silicon layer has an arsenic concentration between about $1\times10^{20}$ cm$^{-3}$ and about $4\times10^{21}$ cm$^{-3}$. In some embodiments, the first epitaxial silicon layer has a carbon concentration of between about $1\times10^{18}$ cm$^{-3}$ and about $1\times10^{21}$ cm$^{-3}$. In some embodiments, the substrate comprises one or a combination of silicon and germanium. In some embodiments, the first epitaxial silicon layer includes a combination of Si:As and Si:As:C sublayers.

In another embodiment, a semiconductor device includes a plurality of monocrystalline surfaces, including monocrystalline surfaces of a substrate and an undoped feature extending therefrom, a plurality of amorphous surfaces, including amorphous surfaces of one or more dielectric features disposed in the substrate, and one or more lightly doped Si:As:C layers epitaxially formed on the plurality of monocrystalline surfaces. Herein, each of the one or more lightly doped Si:As:C layers has a uniform arsenic concentration and a uniform carbon concentration at surfaces proximate to the underlying monocrystalline surfaces of the substrate and the undoped feature. In some embodiments, each of the one or more lightly doped Si:As:C layers includes a horizontal portion formed on the monocrystalline surfaces of the substrate between one of the one or more dielectric features and the undoped feature, and a vertical portion normal to the horizontal portion and formed on the undoped feature. In some embodiments, at least a portion of the one or more lightly doped Si:As:C layers has an arsenic concentration between about $1\times10^{20}$ cm$^{-3}$ and about $4\times10^{21}$ cm$^{-3}$. In some embodiments, at least a portion of the one or more lightly doped Si:As:C layers have a carbon concentration of between about $1\times10^{18}$ cm$^{-3}$ and about $1\times10^{21}$ cm$^{-3}$. In some embodiments, the semiconductor device further includes one or more highly doped features epitaxially formed on the one or more lightly doped Si:As:C layers. In some embodiments, the one or more highly doped features include epitaxially formed Si:As or Si:P features or combinations thereof. In some embodiments, the substrate comprises silicon, germanium, or combinations thereof. In some embodiments, at least one of the one or more highly doped features has a uniform arsenic concentration of between about $2\times10^{20}$ cm$^{-3}$ and about $5\times10^{21}$ cm$^{-3}$. In some embodiments, at least a portion of at least one of the one or more highly doped features has a uniform phosphorous concentration between about $2\times10^{20}$ cm$^{-3}$ and about $5\times10^{21}$ cm$^{-3}$. In some embodiments, each of the one or more lightly doped Si:As:C layers is coextensive with the horizontal and vertical portions. In some embodiments, each of the one or more lightly doped Si:As:C layers comprises a combination of Si:As and Si:As:C sublayers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments described herein generally relate to a semiconductor device and methods of manufacturing the semiconductor device. More specifically, embodiments described herein relate to a method of selective epitaxial deposition (growth) of an arsenic doped silicon (Si:As) layer for use as source and drain extensions followed by selective epitaxial formation of a source and a drain comprising either Si:As or phosphorus doped silicon (Si:P). The methods disclosed herein provide for the selective epitaxial deposition (growth) of self-aligned lightly and highly doped silicon layers without the need for a co-flowed, non-silicon based silicon etching, precursor. The lightly doped and highly doped silicon epitaxial layers provide uniform doping of the source and drain extensions and of the source and the drain without using ion implantation and are deposited (grown) at relatively low processing temperatures. The dopant concentration at the interface between the source and drain extensions and the adjacent undoped channel of the fin is abrupt and free of shadowing effects so that current flow across the undoped channel is uniform and predictable. Because ion implantation is not used to dope the source and drain extensions, the fin is not exposed to ion implant processes that could undesirably convert the structure thereof to an amorphous structure and/or damage the fin.

Figure 2A:
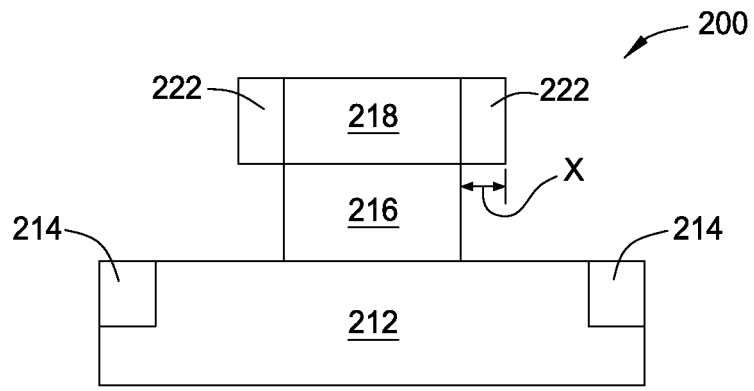
FIGS. 2A-2C illustrate the formation of source and drain extensions and source and/or drain features on a 3D FinFET CMOS device, according to the method of FIG. 1.
Figure 2B:
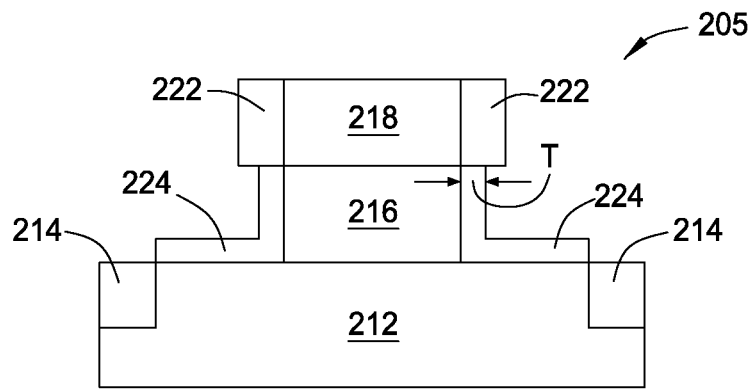
Figure 2C:
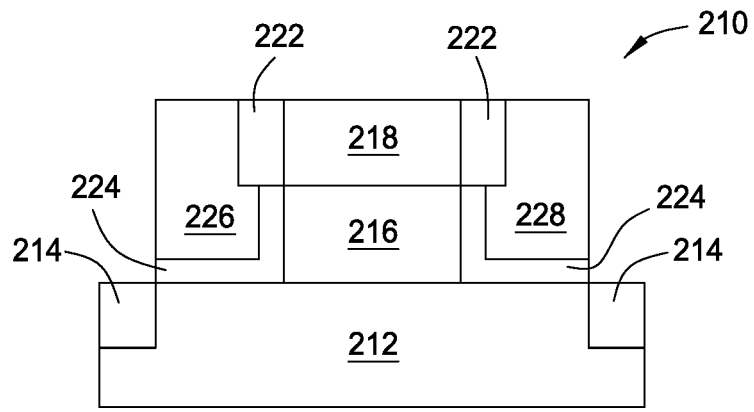

The Si:As epitaxial layers, deposited (grown) according to embodiments described herein, are used to form self-aligned source and drain extensions and self-aligned source and drain regions on a patterned substrate, such as the substrate 212 shown in FIG. 2C. Using the method herein, Si:As epitaxial layers, such as the source and drain extensions 224 in FIG. 2C will epitaxially grow by deposition of a base material capable of forming an epitaxial film layer upon deposition thereof on the underlying monocrystalline surface and a dopant from an appropriate base material precursor and dopant precursor, such as the surface of the substrate 212 and the surface of a fin 216, but not deposit a base material and dopant composition on amorphous surfaces, such as the surfaces of the one or more shallow trench isolation (STI) regions 214 or spacers 222, or on polycrystalline surfaces, such as the surface of a dummy gate 218. The resulting source and drain extensions 224 and similarly formed source and drain features 226 and 228 are thus self-aligned upon deposition (growth) thereof, because the source and drain extensions 224 are formed on the monocrystalline active regions of the substrate up to the interface or border between the monocrystalline active region and the STI region 214 defining the active region. Further, according to embodiments herein, any non-epitaxial Si:As material deposited on the substrate 212 during the formation of the Si:As epitaxial layers is simultaneously, or temporally, selectively etched from the non-monocrystalline surfaces of the substrate 212 and/or features thereon.

Deposition of Si:As epitaxial layers using the embodiments herein comprises using a halogenated silicon precursor, such as trichlorosilane (TCS), and a arsenic precursor, such as tertiarybutyl arsine (TBA), to grow the Si:As material as an epitaxial layer on monocrystalline surfaces of the substrate 212. The TCS/TBA process is selective, meaning that the TCS/TBA process causes a Si:As epitaxial layer to deposit (grow) on monocrystalline silicon substrate surfaces while preventing Si:As layers, epitaxial or otherwise, from permanently forming on non-monocrystalline silicon substrate surfaces. In this selective Si:As epitaxial deposition process, any silicon film formed on non-monocrystalline silicon surfaces of the substrate deposits as a polycrystalline and/or amorphous film, and it is simultaneously etched away by reactions with by-products of the reaction causing the Si:As deposition, while the Si:As epitaxial film deposited (grown) on the monocrystalline portions of the substrate surface remains on the mono-crystalline silicon substrate surfaces to form the self-aligned Si:As epitaxial layers. This is possible because the etch rate of amorphous and polycrystalline silicon is greater than the etch rate of epitaxial silicon when both are exposed to halogen radicals generated during the reaction of the precursors used to deposit (grow) the Si:As epitaxial layer. Thus, in some embodiments herein, the TCS/TBA process is self-selective, this means that the amount of chlorine radicals provided by the TCS, as opposed to another source, are sufficient to prevent non-monocrystalline Si:As films from forming on non-monocrystalline surfaces.

In the process described herein, thermal decomposition (catalyzation) of the molecules of the halogenated silicon precursor used to deposit (grow) the Si:As epitaxial layers occurs upon contact of the precursor molecules with the heated substrate surface. The surface catalyzed deposition process generates halogen radicals from the catalyzed precursor molecule simultaneously with, and in the same location as, silicon radicals that deposit a silicon film on the substrate surface. Where decomposition of the halogenated silicon precursor occurs on a monocrystalline surface of the substrate or the features thereon, an epitaxial As doped silicon film deposits (grows) on the monocrystalline surface faster than the epitaxial As doped silicon film can be etched away by the generated halogen radicals. Where decomposition occurs on a polycrystalline or amorphous silicon or other dielectric surface of the substrate or the features thereon, the resulting Si:As film deposit will not be monocrystalline and the fragmented halogen radicals will etch the resulting non-monocrystalline As doped silicon material deposited on these surfaces as soon as it is deposited Because the halogen radical is generated at the same location as where the silicon radical is generated, it does not need to independently diffuse to a desired etching area of the substrate, unlike where a non-silicon based silicon etching precursor, such as HCl, is additionally employed to deposit a silicon film and selectively remove the non-epitaxial portion thereof. Thus, in situ generation of the halogen radical by catalytically decomposing the halogenated silicon precursor, at the same location and time of silicon generation from the precursor, allows for more uniform material layer deposition than provided by co-flowing a silicon deposition precursor and a non-silicon based silicon etching precursor, such as HCl or another halogen precursor that does not contain silicon. The simultaneous deposition of As doped silicon and etching where deposited (grown) non-epitaxially provided by the embodiments described herein, allows for deposition (growth) of self-aligned and uniformly doped Si:As epitaxial layers of uniform thickness on surfaces over small surface areas. For example, the embodiments described herein are used to form source and drain extensions on the surfaces on the sides of, and on the substrate surface adjacent to, the silicon fin of a FinFET transistor in a 3D structure, and thus deposit source and drain extensions of a uniform thickness and concentration below an overhanging extension, such as below an overhanging spacer or dummy gate.

In one embodiment, the halogenated silicon precursor is a halogenated silane, such as a chlorinated silane, such as monochlorosilane (MCS), dichlorosilane (DCS), trichlorosilane (TCS), silicon tetrachloride (STC), hexachlorodisilane (HCDS), octachlorotrisilane (OCTS), or a combination thereof. Generally, thermal stability of chlorinated silanes increases with the number of chlorine atoms in the silane molecule, for example STC is more thermally stable than TCS and requires a higher temperature to catalyze. MCS and DCS decompose at lower temperatures than TCS, but they do not generate as many chlorine radicals when they are catalyzed, which means that the etch rate of the resulting silicon material deposited on silicon surfaces of the substrate, or the features thereon, is lower than that resulting from the use of TCS for a similar epitaxial silicon deposition rate. Generally, the deposition rate of epitaxial silicon using MCS and/or DCS under process conditions where MCS and/or DCS deposit a self-selective epitaxial layer as described above are much lower than the deposition rate of epitaxial silicon using TCS to deposit a self-selective epitaxial layer as described above. Herein, the flow rate of the halogenated silicon precursor is between about 100 sccm and about 10,000 sccm, such as between about 100 sccm and about 2000 sccm, such as between about 100 sccm and about 1500 sccm, such as between about 500 sccm and about 1000 sccm, for example about 800 sccm. In one embodiment, the halogenated silicon precursor is TCS. In another embodiment, MCS and/or DCS are added to the TCS to increase the deposition rate of the doped epitaxial silicon layer. The flow rates herein are for a chamber configured to process a 300 mm diameter substrate and are scalable for chambers configured to process different sized substrates.

In one embodiment, a non-halogenated silicon precursor is added to the halogenated silicon precursor to increase the deposition rate of the epitaxial silicon layer. The non-halogenated precursor contains a silicon source, such as a silane, an organosilane, or a combination thereof. Silanes useful herein include silane ($SiH_4$), and higher silanes with the empirical formula $Si_nH_{(2n+2)}$, such as disilane ($Si_2H_6$), trisilane ($Si_3H_8$), and tetrasilane ($Si_4H_{10}$), and combinations thereof. Organosilanes useful herein include compounds with the empirical formula $R_ySi_nH_{(2n+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$), and combinations thereof. Organosilianes provide a carbon source, in addition to a silicon source, when carbon doping of the silicon epitaxial layer is desired.

Arsenic doping of the lightly doped and highly doped Si:As layers herein is provided by co-flowing an arsenic precursor, such as arsine ($AsH_3$), tributyl arsine, or tertiarybutyl arsine (TBA), with the TCS and where used, additional other silicon precursor(s). The flow rate of the arsenic precursor is between about 0.1 sccm and about 100 sccm, such as between about 0.1 sccm and about 50 sccm, such as between about 0.1 sccm and about 20 sccm, such as between about 0.1 sccm and about 10 sccm, for example about 4 sccm. The concentration of arsenic in the Si:As material is determined by a ratio of the halogenated silicon precursor and additional other silicon precursor(s), where used, to the arsenic precursor. In one embodiment, the ratio of TCS precursor flow rate to TBA precursor flow rate is between about 400:1 and about 1:1, such as between about 300:1 and about 100:1 for example a ratio of about 200:1 TCS precursor flow rate to TBA precursor flow rate provides an arsenic chemical concentration of about $1.2 \times 10^{21}$ $cm^{-3}$ in the deposited Si:As epitaxial layer.

In one embodiment, an additional silicon etchant precursor is provided by a non-silicon based silicon etching precursor containing a halogen, such as chlorine ($Cl_2$), hydrogen chloride (HCl), boron trichloride ($BCl_3$), carbon tetrachloride ($CCl_4$), chlorotrifluoride ($ClF_3$), or a combination thereof. The non-silicon based silicon etching precursor is added when over-selectivity, that is an etch rate of non-monocrystalline silicon that exceeds and is not just equal to its deposition rate, is desired or when the deposition process is not self-selective, that is, an undesirable deposition of a non-monocrystalline Si:As layer on non-monocrystalline surfaces of, or formed on, the substrate in addition to the desired deposition of a Si:As epitaxial layer on monocrystalline surface of, or formed on, the substrate occurs due to high substrate or process temperatures. High temperatures cause an increase in the deposition rate of silicon on non-monocrystalline silicon surfaces relative to the inherent etch rate of silicon from those surfaces from the halogen species of the silicon source precursor, and when the silicon deposition rate exceeds the silicon etch rates of non-monocrystalline silicon surfaces, the process is no longer selective to only epitaxial layer deposition (growth). To address this issue, a non-silicon based silicon etching precursor such as HCL or other halogen precursor, is added to the precursors TCS and TBA where the process temperature is high, for example at a process temperatures greater than about 680° C., in order to maintain selective epitaxial deposition (growth) of doped silicon on monocrystalline surfaces. The flow rate of the non-silicon based silicon etching precursor, when used, is between about 0.1 sccm and about 100 sccm, such as between about 1 sccm and about 50 sccm, such as between about 1 sccm and about 20 sccm, for example about 10 sccm. In one embodiment, using the TCS precursor and the TBA precursor, and where the process temperature is greater than about 680° C., a ratio of TCS precursor flow rate to HCL precursor flow rate is between about 2000:1 and about 4:1, such as between about 100:1 and about 10:1, for example about 80:1.

Process conditions for the embodiments disclosed herein include pressure, temperature, and/or carrier gas flow rate. The pressure of the processing chamber is maintained so that a reaction region pressure is between about 1 Torr and about 760 Torr, such as between about 10 Torr and 450 Torr. The temperature of the substrate is desirably maintained so that a reaction region formed on or near the surface of the substrate is between about 300° C. and about 750° C., such as between about 400° C. and about 750° C., such as between about 400° C. and 680° C., such as between about 400° C. and about 500° C. Lower temperatures during the process desirably allow for reduced consumption of the total thermal budget for forming the underlying integrated circuit or other semiconductor device, which continues to shrink with decreasing device size, reduced tolerance for diffusion, and the continued introduction of new materials with lower resistance to thermally induced change.

In one embodiment, the halogenated silicon precursor is TCS, the arsenic precursor is TBA, and no additional etchant is used. Benefits of the TCS and TBA process include lower process temperature, self-selectivity to deposit (grow) a Si:As epitaxial layer on an underlying monocrystalline surface of, or formed on, the substrate, reasonable deposition rate, and epitaxial deposition (growth) of a Si:As layer at doping levels high enough to be used for source and drain extensions and/or source and drain features. TCS decomposes at a lower temperature than many common silicon etchant sources, for example HCl, which requires an activation temperature of more than about 700° C. to act as an effective etchant, and TBA decomposes at lower temperatures then arsine. The hydrogen radicals provided by TBA promote decomposition of TCS at lower processing temperatures, such as below about 300° C., although higher temperatures are required to decompose the majority of TBA in the presence of TCA, such as below about 500° C. The lower decomposition temperature of TBA in the presence of TCS (as opposed to other precursors) allows for arsenic doping at a high enough concentration that the resulting Si:As can be used to form both lightly doped source and drain extensions and highly doped source and/or drain features. When co-flowed with TCS, TBA improves the rate of TCS decomposition so that the deposition rate of the epitaxial layer is increased by about ten times, for example from about 1 angstrom per minute (Å/min) to about 10 Å/min. Additionally, the TCA and TBA process is performed at low enough temperatures that the deposition rate of amorphous and/or polycrystalline silicon on non-monocrystalline silicon surfaces does not exceed the etching rate of the deposited material In combination with TCA, TBA promotes a higher deposition rate of lightly doped and highly doped Si:As layers, at lower temperatures, and without having a negative impact on the self-selectivity of TCA to form an epitaxial silicon layer, when compared to selective epitaxial silicon processes using other precursors.

Herein, the halogenated silicon precursor and the arsenic precursor are diluted with a carrier gas, such as hydrogen, argon, helium, nitrogen, or a combination thereof, for example hydrogen or nitrogen. For a 300 mm diameter substrate the carrier gas has a flow rate of between about 1 standard liter per minute (SLM) to about 100 SLM, such as between about 2 SLM and about 10 SLM. In another embodiment the carrier gas is omitted. In one embodiment, in a TCS and TBA process, a ratio of TCS precursor flow rate to carrier gas flow rate is between about 1:50 and about 1:1.

Si:P (phosphorous doped silicon) epitaxial layers can be formed using similar process conditions as for the Si:As layers described above. The Si:P layer is formed using at least one of the halogenated silicon precursor, or the non-halogenated silicon precursor combined with the non-silicon based silicon etching precursor and a phosphorus precursor, such as phosphine (PH3), or an alkyl phosphine such as trimethylphosphine (($CH_3$)$_3$P), tertiarybutylphosphine (($CH_3$)$_3$CPH$_2$), dimethylphosphine (($CH_3$)$_2$PH), triethylphosphine (($CH_3CH_2$)$_3$P), and diethylphosphine (($CH_3CH_2$)$_2$PH), or combinations thereof. The phosphorus precursor has a flow rate of between about 0.1 sccm and about 100 sccm, such as between about 0.1 sccm and about 50 sccm, such as between about 0.1 sccm and about 20 sccm, such as between about 0.1 sccm and about 10 sccm. In one embodiment, a non-silicon based silicon etching precursor is additionally used to further enhance the selectively of the process. Other processing conditions such as flow rates for the silicon precursor, carrier gas, and non-silicon based silicon etching precursor, when used, as well as process temperatures and pressures are as described above.

Figure 1:
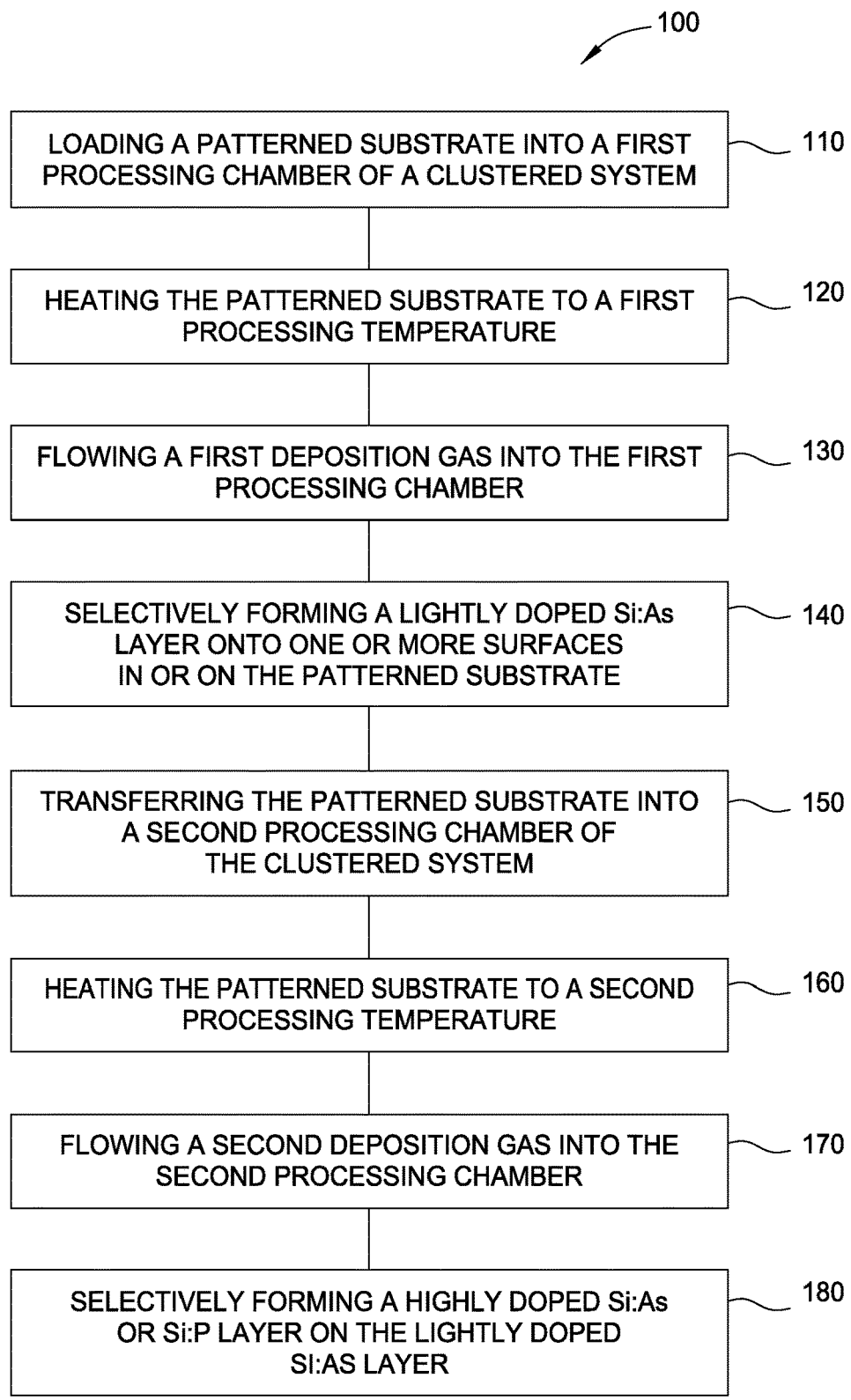
FIG. 1 is a flowchart illustrating a method of selectively forming lightly doped and highly doped epitaxial silicon layers on monocrystalline surfaces of, or present on, a substrate according to an embodiment of the present disclosure.

FIG. 1 is a flowchart illustrating a method 100 of selectively forming lightly doped and highly doped epitaxial silicon layers on monocrystalline surfaces of, or formed on, a substrate. FIGS. 2A-2C illustrate the formation of source and drain extensions and source and/or drain features on a 3D FinFET CMOS device, according to the method of FIG. 1. The method 100 begins at activity 110 with loading a patterned substrate into a first processing chamber. A patterned substrate is illustrated in FIG. 2A where the substrate 212 has a first pattern 200. The first pattern 200 comprises monocrystalline surfaces, such as the surface of the substrate 212 and the surface of the fin 216, amorphous surfaces, such as the surface of the one or more STI regions 214 and the spacers 222, and polycrystalline surfaces, such as the surface of the dummy gate 218. The first processing chamber is maintained at a pressure of between about 10 Torr and about 450 Torr.

The method 100 continues at activity 120 with heating the substrate 212 to a first processing temperature of between about 400° C. and about 750° C., such as between about 400° C. and about 680° C.

The method 100 continues at activity 130 with flowing a first gas into the first processing chamber. Herein, the first gas contains at least a halogenated silicon precursor, an arsenic precursor, and a carrier gas such as argon.

The method 100 continues at activity 140 with selectively depositing (growing) a lightly doped Si:As epitaxial layer onto one or more of the monocrystalline surfaces. Herein, the lightly doped Si:As epitaxial layer is used to form the source and drain extensions 224 on monocrystalline surfaces of, or formed on, the substrate 212, such as the surface of the substrate 212 and the exposed surfaces of the fin 216 including the side surfaces thereof, as shown in FIG. 2B. Si:As layers, epitaxial or otherwise, are not formed on the non-monocrystalline surfaces such as the one or more STI regions 214, the spacers 222, and the dummy gate 218 because silicon deposited thereon during the process is etched away. Because the lightly doped Si:As epitaxial layer only forms on monocrystalline surfaces the source and drain extensions 224 are self-aligned over the monocrystalline surfaces where the source and drain 226 and 228 need to be present, and do not require further substrate processing to define their location.

The method 100 continues at activity 150 with transferring the substrate to a second processing chamber in a clustered processing chamber system without exposing the substrate to an external to the system atmosphere. The second processing chamber is maintained at a pressure of between about 10 Torr and about 450 Torr. The second processing chamber may be a thermal processing chamber configured to perform deposition on the substrate.

The method 100 continues at activity 160 with heating the substrate to a second processing temperature of between about 400° C. and about 750° C.

The method 100 continues at activity 170 with flowing a second gas into the second processing chamber. The second gas contains at least a silicon precursor, a carrier gas, and a dopant precursor, such as an arsenic precursor or a phosphorus precursor. The silicon precursor gas is either a halogenated silicon precursor or a non-halogenated precursor. In some embodiments, such as those that do not use the halogenated silicon precursor, the gas further comprises a non-silicon based silicon etching precursor.

The method 100 ends at activity 180 with selectively depositing (growing) highly doped Si:As or Si:P epitaxial layers on the previously formed lightly doped Si:As epitaxial layers, such as the source and drain extensions 224. The highly doped Si:As or Si:P epitaxial layers are used to form the source feature 226 and/or the drain feature 228, as shown in FIG. 2C. Because the highly doped Si:As or Si:P epitaxial layers will only be deposited (grown) on monocrystalline silicon surfaces of the substrate, the source and drain features 226 and 228 are self-aligned and do not require further substrate processing to define their location. In another embodiment, both lightly doped and highly doped layers are Si:As epitaxial silicon and activities 160 to 180 take place in the same processing chamber as used for activities 110 to 140.

In another embodiment, the method 100 includes forming a carbon doped epitaxial Si:As layer, herein an epitaxial Si:As:C layer or sublayer, by co-flowing a carbon precursor with the halogenated silicon precursor and the argon precursor. Examples of carbon precursors herein include monomethylsilane (MMS or $CH_3$—$SiH_3$), dimethylsilane (($CH_3$)$_2$SiH$_2$), ethylsilane (($CH_3CH_2$)SiH$_3$), dimethyldisilane (($CH_3$)$_2$Si$_2$H$_4$), hexamethyldisilane (($CH_3$)$_6$Si$_2$), trimethylsilane (($CH_3$)$_3$SiH), silacyclobutane (SiC$_3$H$_8$), methyltrichorosilane ($CH_3SiCl_3$), carbon tetrachloride ($CCl_4$), bromotrichloromethane ($CCl_3Br$), and combinations thereof. In one embodiment, a ratio of carbon precursor to halogenated silicon precursor is adjusted so that the carbon chemical concentration in the Si:As:C layer or at least a portion of the Si:As:C layer, such as a Si:As:C sublayer, is between about $1 \times 10^{18}$ cm$^{-3}$ and about $1 \times 10^{21}$ cm$^{-3}$.

In some embodiments, the halogenated silicon precursor comprises TCS, the arsenic precursor comprises TBA or AsH$_3$, and the carbon precursor comprises MMS. The concentration of carbon in the Si:As:C material is determined by a ratio of the halogenated silicon precursor and additional other silicon precursor(s), where used, to the carbon precursor. In some embodiments, for example in embodiments where the carbon precursor comprises MMS, the flow rate of the carbon precursor is between about 0.05 sccm and about 20 sccm, such as between about 0.05 sccm and about 10 sccm, for example between about 0.05 sccm and about 1 sccm, or less than about 1 sccm. In one embodiment, the ratio of TCS precursor flow rate to MMS precursor flow rate is between about 400:1 and about 1:1, such as between about 300:1 and about 100:1.

FIG. 2C illustrates a 3D FinFET device 210 formed according to the embodiments described herein. The 3D FinFET device 210 has one or more STI regions 214 extending inwardly of the surface of the substrate 212, which surround and thus define an active region within which a fin 216 extends vertically from the base surface of the substrate 212. Herein, the one or more STI regions 214 contain an amorphous dielectric material, such as silicon dioxide, and the substrate 212 comprises a monocrystalline material, such as crystalline silicon. The fin 216 also comprises a monocrystalline material such as an epitaxially grown or deposited silicon or epitaxially grown or deposited silicon/germanium, where the fin 216 comprises silicon/germanium, the germanium concentration is between about 10 atomic % and about 80 atomic % of the fin material.

A dummy gate 218, also known as a sacrificial gate, is disposed on the fin 216 and spacers 222 are formed on the sides of the dummy gate 218. Herein, the dummy gate 218 comprises a polycrystalline material, such as polysilicon, and the spacers 222 comprise an amorphous dielectric material, such as silicon nitride. The fin 216 has been laterally etched so that it is recessed by a distance X (as shown in FIG. 2A) from the outside edges of the spacers 222. Herein, the distance X is between about 1 nm and about 15 nm, such as between about 3 nm and 10 nm, such as between about 5 nm and 10 nm, for example about 6 nm.

The source and drain extensions 224 comprise a lightly doped Si:As epitaxial material deposited (grown) according to the method described in FIG. 1. The source and drain extensions 224 are selectively deposited (grown) on the monocrystalline surfaces of the exposed sides of the fin 216 and on the substrate 212 within the active region defined by the one or more STI regions 214. Each of the source and drain extensions 224 comprise a continuous layer having a horizontal portion on the substrate 212 and a vertical portion that is substantially normal to the horizontal portion thereof and adjacent to the fin 216. The horizontal portions of the source and drain extensions 224 are coextensive with the surface of the substrate 212 between the fin 216 and the STI regions 214 and the vertical portions of the source and drain extensions 224 are coextensive with the surfaces of the sides of the fin 216 above the horizontal portion. As used herein, coextensive with the substrate 212 means the horizontal portion of the source and drain extensions 224 completely covers the substrate 212 surface between the fin 216 and one of the one or more STI regions 214 and shares a vertical boundary with the one of the one or more STI regions 214 and the substrate 212 surface. Coextensive with the fin 216 means the vertical portion of the source and drain extensions 224 completely covers the side of the fin 216 above the horizontal portion to the location of one of the dummy gate, the side wall spacers, or other previously formed overlying feature on the fin. However, it is recognized that isotropic growth during the deposition process will cause some lateral overgrowth of the horizontal portions of the source and drain extensions 224 over the STI regions at the ends of the source and drain extensions 224 and that the description coextensive with the substrate 212 includes this lateral overgrowth. In this embodiment, the source and drain extensions 224 have a thickness T of between about 3 nm and 20 nm, such as between about 3 nm and about 10 nm, between about 6 nm and about 20 nm, or between about 6 nm and about 10 nm. The thickness of the source and drain extensions 224 is determined, in part, on diffusion tolerances from the source and drain features 226 and 228 into and/or through the source and drain extensions 224 and/or into the undoped channel of the fin 216 for the designated thermal budget for the device. Herein, the thickness non-uniformity of the source and drain extensions is less than about 10%, such as less than about 5%, for example less than about 2%. The lateral overgrowth of the source and drain extensions 224 over the STI regions 214 is less than about 5% of the thickness T, such as less than about 2%, such as less than about 1%. In one embodiment, the thickness T of the source and drain extensions 224 is less than the recess of the fin 216 of distance X, as shown in FIGS. 2A-2C. In another embodiment, the thickness T of the source and drain extensions 224 is greater than or equal to the recess of the fin 216 of distance X. Herein, the concentration of the arsenic dopant across the thickness T is constant, however, in other embodiments the concentration of the arsenic dopant has a gradient starting with a lower concentration at the interface of the source and drain extensions 224 and the fin 216 and increasing with increased distance from the fin 216. In one embodiment, a gradient of arsenic dopant concentration is achieved by continually increasing the arsenic precursor flowrate during the process of depositing the source and drain extensions 224.

In some embodiments, the source and drain extensions 224 comprise a lightly doped Si:As:C material which is the Si:As material above further doped with carbon. In some embodiments, the concentration of carbon dopant across the thickness T is constant. In some embodiments, the concentration of the carbon dopant has a gradient starting with a lower concentration at the interface of the source and drain extensions 224 and the fin 216 and increasing with increased distance from the fin 216. In some embodiments, the concentration of the carbon dopant has a gradient starting with a higher concentration at the interface of the source and drain extensions 224 and the fin 216 and decreasing with increased distance from the fin 216.

In some embodiments, the carbon precursor is pulsed during the deposition process described in FIGS. 1 so that the source and drain extensions 224 comprise a layered stack of a Si:As:C sublayer interposed between two Si:As sublayers. In some embodiments, the source and drain extensions 224 comprise a plurality of sequentially deposited Si:As and Si:As:C sublayers. The source and drain extensions 224 herein act as a barrier to undesirable diffusion of arsenic and/or phosphorus from highly doped source and/or drain features 226 and 228 into the undoped channel region of the fin 216 therebetween. In some embodiments, the carbon chemical concentration in at least a portion of the Si:As:C layer, such as in a Si:As:C sublayer, is between about $1 \times 10^{18}$ cm$^{-3}$ and about $1 \times 10^{21}$ cm$^{-3}$.

In one embodiment, the selective epitaxial deposition processes disclosed herein are used to form source and drain features 226 and 228 by selectively depositing (growing) a highly doped Si:As epitaxial layer on the previously formed source and drain extensions 224. In this embodiment, the highly doped Si:As epitaxial layer is deposited (grown) by adjusting the ratio of the silicon precursor(s) to the arsenic precursor(s). The highly doped Si:As layer used for the source and/or drain features 226 and 228 herein has an arsenic chemical concentration of between about $5 \times 10^{20}$ $cm^{-3}$ and about $5 \times 10^{21}$ $cm^{-3}$. The source and drain extension 224 and the source and drain features 226 and 228 are formed sequentially in the same processing system, and in one, or two different, chambers thereof, so that the substrate is not exposed to the external atmosphere between the deposition of the source and drain extensions 224 and the source and drain features 226 and 228.

In another embodiment, the source and drain features 226 and 228 are formed by selectively depositing highly doped Si:P epitaxial material on the previously formed source and drain extensions 224. The Si:P epitaxial material is deposited in a different processing chamber then the previously formed Si:As source and drain extensions 224. The processing chamber used to deposit the Si:P layer is connected to the processing chamber used to deposit the Si:As layer by means of a transfer chamber so that the substrate is not exposed to the external atmosphere between the deposition processes. The highly doped Si:P epitaxial layer has a phosphorus chemical concentration of between about $5 \times 10^{20}$ $cm^{-3}$ and about $5 \times 10^{21}$ $cm^{-3}$.

The highly doped Si:As or Si:P source and drain features 226 and 228 are coextensive with the horizontal portion of the Si:As source and drain extensions 224 between the vertical portion of the Si:As source and drain extensions 224 and the STI regions 214. However, it is recognized that isotropic growth during the deposition process will cause some lateral overgrowth of the source and drain features 226 and 228 and that the description coextensive with the substrate source and drain extensions 224 includes this lateral overgrowth.

The methods disclosed herein may be performed in thermal processing chambers configured to grow (or deposit) material on the substrate, it being understood that depositing silicon on a monocrystalline silicon material to form an additional epitaxial layer of silicon or doped silicon thereon is known as growing an epitaxial layer. In one embodiment, the processing chambers are CENTURA® RP EPI chambers available from Applied Materials, Inc., of Santa Clara, Calif. Another suitable chamber may be a PRODUCER® CVD chamber also available from Applied Materials, Inc., Santa Clara, Calif.

Benefits of the disclosure include self-selective formation of Si:As epitaxial layers which can be used to form source and drain extensions with uniform doping at relatively low temperatures and with no ion implant damage and/or amorphization of the channel of the fin structure. Further benefits of the disclosure include self-aligned source and drain extensions and source and drain features which eliminate problems related to overlay mismatch and/or alignment problems in forming the source and drain extensions, the source and drain features, and contacts to the source and drain features. Because the source and drain extensions and source and drain features are self-aligned, no setback is required from the STI regions, thus the location of the contact landing area for the contact to the source and drain is more predictable, and can be increased without increasing the width of the active area, thereby reducing the impact of imperfect alignment of contacts to the source and drain due to overlay mismatch of subsequent photolithography operations. Overlay mismatch between the contact and the source and drain can result in poor or failed device performance.

While the foregoing is directed to embodiments of the present disclosure, other and further embodiments of the disclosure may be devised without departing from the basic scope thereof, and the scope thereof is determined by the claims that follow.

The invention claimed is:

1. A method of depositing a layer, comprising:
heating a substrate in a processing chamber to a processing temperature, the substrate having one or more monocrystalline surfaces and one or more non-monocrystalline surfaces;
flowing a processing gas into the processing chamber, the processing gas comprising a halogenated silicon precursor, an arsenic precursor, and a carbon precursor; and
selectively depositing an epitaxial Si:As:C layer on the one or more monocrystalline surfaces, wherein the epitaxial Si:As:C layer comprises a combination of epitaxial Si:As and epitaxial Si:As:C sublayers.

2. The method of claim 1, wherein at least one of the one or more monocrystalline surfaces comprises silicon and at least one of the one or more non-monocrystalline surfaces comprises a dielectric material.

3. The method of claim 1, wherein at least a portion of the epitaxial Si:As:C layer has an arsenic concentration of between about $1 \times 10^{20}$ $cm^{-3}$ and about $2 \times 10^{21}$ $cm^{-3}$.

4. The method of claim 1, wherein the halogenated silicon precursor comprises a chlorinated silane.

5. The method of claim 4, wherein the chlorinated silane comprises trichlorosilane.

6. The method of claim 5, wherein the arsenic precursor comprises tertiarybutyl arsine.

7. The method of claim 1, wherein the carbon precursor is selected from the group consisting of methylsilane, dimethylsilane, ethylsilane, dimethyldisilane, trimethylsilane, hexamethyldisilane, silacyclobutane, methyltrichorosilane, carbon tetrachloride, bromotrichloromethane, and combinations thereof.

8. The method of claim 1, wherein at least a portion of the epitaxial Si:As:C layer has carbon concentration of between about $1 \times 10^{18} cm^{-3}$ and about $1 \times 10^{21} cm^{-3}$.

9. The method of claim 6, wherein the processing temperature is between about 400° C. and about 680° C.

10. The method of claim 9, wherein the epitaxial Si:As:C layer has a thickness between about 2 nm and about 50 nm.

11. A method of depositing a layer, comprising:
heating a substrate in a processing chamber to a processing temperature, the substrate having one or more monocrystalline surfaces and one or more non-monocrystalline surfaces;
flowing a processing gas into the processing chamber, the processing gas comprising a halogenated silicon precursor, an arsenic precursor, and a carbon precursor;
selectively depositing an epitaxial Si:As:C layer on the one or more monocrystalline surfaces; and
depositing an epitaxial silicon layer on the epitaxial Si:As:C layer, the epitaxial silicon layer having an arsenic or phosphorous concentration between $3 \times 10^{20}$ $cm^{-3}$ and about $5 \times 10^{21}$ $cm^{-3}$.

12. A method of forming a device, comprising:
heating a substrate to a processing temperature in a processing chamber, the substrate having one or more features disposed on the substrate, the substrate and the one or more features having at least monocrystalline surfaces and amorphous surfaces;

flowing a gas into the processing chamber, the gas comprising a halogenated silane, an arsenic precursor, and a carbon precursor;

selectively depositing an epitaxial Si:As:C layer on the monocrystalline surfaces; and selectively depositing an epitaxial silicon based layer on the epitaxial Si:As:C layer, wherein a dopant of the epitaxial silicon based layer comprises arsenic or phosphorous, and wherein a concentration of the dopant in the epitaxial silicon based layer is more than a concentration of arsenic in the epitaxial Si:As:C layer.

13. The method of claim 12, wherein the halogenated silane comprises trichlorosilane and the arsenic precursor comprises tertiarybutyl arsine.

14. The method of claim 12, wherein the carbon precursor is selected from the group consisting of methylsilane, dimethylsilane, ethylsilane, dimethyldisilane, trimethylsilane, hexamethyldisilane, silacyclobutane, methyltrichorosilane, carbon tetrachloride, bromotrichloromethane, and combinations thereof.

15. A semiconductor device, comprising:

a substrate;

one or more shallow trench isolation regions defining an active region on the substrate, each of the one or more shallow trench isolation regions comprising a dielectric material;

an undoped monocrystalline feature disposed on the substrate in the active region; and a first epitaxial silicon layer comprising:

a horizontal portion located on the substrate, the horizontal portion having a first end proximate to one of the one or more shallow trench isolation regions and a second end adjacent to the undoped monocrystalline feature, wherein the first end has a first arsenic concentration and a first carbon concentration at a distance from the substrate; and a vertical portion normal to the horizontal portion and adjacent to the undoped monocrystalline feature, wherein the vertical portion has a third end adjacent to the second end of the horizontal portion and a fourth end distal to the third end, the fourth end having a second arsenic concentration and a second carbon concentration at a distance from the horizontal portion, wherein the first arsenic concentration and the second arsenic concentration have a variation of less than about 10%, and wherein the first carbon concentration and the second carbon concentration have a variation of less than about 10%.

16. The semiconductor device of claim 15, wherein at least a portion of the first epitaxial silicon layer has an arsenic concentration between about $1\times10^{20}$ cm$^{-3}$ and about $4\times10^{21}$ cm$^{-3}$ and a carbon concentration of between about $1\times10^{18}$ cm$^{-3}$ and about $1\times10^{21}$ cm$^{-3}$.

17. The semiconductor device of claim 16, further comprising a second epitaxial silicon layer on the first epitaxial silicon layer, wherein the second epitaxial silicon layer has a uniform arsenic or phosphorous concentration between $2\times10^{20}$ cm$^{-3}$ and about $5\times10^{21}$ cm$^{-3}$.

18. The method of claim 1, wherein at least one of the non-monocrystalline surfaces comprises an amorphous surface.

* * * * *

UNITED STATES PATENT AND TRADEMARK OFFICE
CERTIFICATE OF CORRECTION

PATENT NO. : 10,256,322 B2
APPLICATION NO. : 15/926921
DATED : April 9, 2019
INVENTOR(S) : Xinyu Bao et al.

Page 1 of 1

It is certified that error appears in the above-identified patent and that said Letters Patent is hereby corrected as shown below:

In Column 7, Line 29, delete "Organosilianes" and insert -- Organosilanes --, therefor.

In Column 10, Lines 60-61, delete "methyltrichorosilane" and insert -- methyltrichlorosilane --, therefor.

In Column 10, Line 61, delete "(CCI$_4$)," and insert -- (CCI$_4$)," --, therefor.

In Column 12, Line 51, delete "FIGS." and insert -- FIG. --, therefor.

In Column 14, Line 38, in Claim 7, delete "methyltrichorosilane," and insert -- methyltrichlorosilane, --, therefor.

In Column 14, Line 43, in Claim 8, delete "$10^{18}cm^{-3}$" and insert -- $10^{18}$ cm$^{-3}$ --, therefor.

In Column 14, Line 43, in Claim 8, delete "$10^{21}cm^{-3}$." and insert -- $10^{21}$ cm$^{-3}$. --, therefor.

In Column 15, Line 18, in Claim 14, delete "methyltrichorosilane," and insert -- methyltrichlorosilane, --, therefor.

Signed and Sealed this
Eighteenth Day of June, 2019

Andrei Iancu
*Director of the United States Patent and Trademark Office*